United States Patent
Kaushansky et al.

(10) Patent No.: US 11,408,927 B2
(45) Date of Patent: Aug. 9, 2022

(54) FUNCTIONAL TESTING WITH INLINE PARAMETRIC TESTING

(71) Applicant: Teradyne, Inc., North Reading, MA (US)

(72) Inventors: David Kaushansky, Winchester, MA (US); Thomas D. Jacobs, Rochdale, MA (US)

(73) Assignee: TERADYNE, INC., North Reading, MA (US)

( * ) Notice: Subject to any disclaimer, the term of this patent is extended or adjusted under 35 U.S.C. 154(b) by 444 days.

(21) Appl. No.: 16/444,459

(22) Filed: Jun. 18, 2019

(65) Prior Publication Data

US 2020/0400741 A1    Dec. 24, 2020

(51) Int. Cl.
*G01R 31/28* (2006.01)

(52) U.S. Cl.
CPC ................................ *G01R 31/2834* (2013.01)

(58) Field of Classification Search
CPC ............ G01R 31/2834; G01R 31/3181; G01R 31/31708
See application file for complete search history.

(56) References Cited

U.S. PATENT DOCUMENTS

| | | | |
|---|---|---|---|
| 6,468,103 B1* | 10/2002 | Brower | H01R 4/2433 439/417 |
| 6,563,352 B1 | 5/2003 | Gohel et al. | |
| 6,894,505 B2 | 5/2005 | Gohel | |
| 7,395,479 B2 | 7/2008 | Gohel et al. | |
| 7,420,375 B2 | 9/2008 | Gohel | |
| 8,310,270 B2 | 11/2012 | Gohel et al. | |
| 8,744,012 B1 | 6/2014 | Ding et al. | |
| 8,988,081 B2 | 3/2015 | Gohel et al. | |
| 9,240,774 B2 | 1/2016 | Gohel | |
| 9,470,759 B2 | 10/2016 | Bourassa et al. | |
| 9,759,772 B2 | 9/2017 | Kaushansky et al. | |
| 10,250,957 B2 | 4/2019 | Gohel et al. | |
| 10,466,301 B1* | 11/2019 | Lee | G01R 31/31703 |
| 2004/0056666 A1 | 3/2004 | Gohel | |
| 2004/0153266 A1* | 8/2004 | Nygaard, Jr. | G01R 13/20 702/68 |
| 2005/0027467 A1* | 2/2005 | Eskeldson | G01R 31/31725 702/64 |
| 2005/0100215 A1* | 5/2005 | Nygaard | G01R 13/029 382/181 |

(Continued)

OTHER PUBLICATIONS

Anritsu, Understanding Eye Pattern Measurements, Application Note No. 11410-00533, 20 pages (2010).

(Continued)

*Primary Examiner* — Manuel A Rivera Vargas
*Assistant Examiner* — Yaritza H Perez Bermudez
(74) *Attorney, Agent, or Firm* — Burns & Levinson LLP

(57) ABSTRACT

An example test system includes a circuit to sample a signal that is repetitive in cycles to obtain data; a processor configured to generate an eye diagram based on the data, where the eye diagram represents parametric information about the signal; and a functional test circuit to receive the signal and to perform one or more functional tests on the signal. The test systems is configured to receive the signal from a unit under test and to allow the signal to pass to the functional test circuit inline without changing at least part of the signal.

24 Claims, 11 Drawing Sheets

(56) References Cited

U.S. PATENT DOCUMENTS

| | | |
|---|---|---|
| 2005/0146320 A1 | 7/2005 | Gohel |
| 2005/0193275 A1 | 9/2005 | Gohel |
| 2005/0222798 A1* | 10/2005 | Waschura ........ G01R 31/31709 702/127 |
| 2006/0161827 A1 | 7/2006 | Gohel et al. |
| 2008/0059102 A1* | 3/2008 | Frankowsky .......... G11C 29/38 702/117 |
| 2008/0238628 A1* | 10/2008 | Lam .......................... H03L 7/16 340/10.3 |
| 2009/0091347 A1 | 4/2009 | Gohel et al. |
| 2010/0002819 A1* | 1/2010 | Conner ................. H04L 7/0037 375/355 |
| 2012/0072785 A1* | 3/2012 | Ding ....................... H04L 1/203 714/704 |
| 2012/0106351 A1 | 5/2012 | Gohel et al. |
| 2013/0106399 A1 | 5/2013 | Gohel et al. |
| 2013/0110445 A1 | 5/2013 | Kaushansky et al. |
| 2013/0110446 A1 | 5/2013 | Bourassa et al. |
| 2013/0124134 A1 | 5/2013 | Gohel |
| 2013/0142520 A1* | 6/2013 | Xie ...................... H04B 10/2507 398/193 |
| 2014/0049302 A1* | 2/2014 | Cheng ................... H03L 7/0995 327/157 |
| 2015/0066409 A1* | 3/2015 | Duff ................... G01R 13/0236 702/67 |
| 2015/0253380 A1* | 9/2015 | Schiessl ............. G01R 31/3183 702/117 |
| 2017/0052558 A1* | 2/2017 | Berge ....................... G06F 1/12 |
| 2017/0187339 A1* | 6/2017 | Moore ................. H03G 3/3089 |
| 2018/0034470 A1* | 2/2018 | Fan ...................... H03M 1/1245 |
| 2018/0083604 A1* | 3/2018 | Lu .............................. H04L 1/20 |
| 2018/0316420 A1 | 11/2018 | Gohel et al. |
| 2018/0316421 A1 | 11/2018 | Gohel et al. |
| 2018/0316423 A1* | 11/2018 | Gohel ............... H04B 10/07955 |
| 2018/0316424 A1 | 11/2018 | Gohel et al. |
| 2018/0316990 A1* | 11/2018 | Gohel ................ H04B 10/0731 |
| 2019/0033372 A1 | 1/2019 | Gohel et al. |
| 2019/0187200 A1* | 6/2019 | Gondi .................... H04B 17/29 |
| 2020/0014501 A1* | 1/2020 | Kang ........................ H04L 1/24 |
| 2021/0194595 A1* | 6/2021 | Gohel .................... H03F 3/189 |

OTHER PUBLICATIONS

Erwin, T., VERTA Integrated Optical Power Management and Switching Instrument, Teradyne, 7 pages (Feb. 2018).

ON Semiconductor, Understanding Data Eye Diagram Methodology for Analyzing High Speed Digital Signals, Publication Order No. AND9075/D, 7 pages, Jun. 2015—Rev. 1.

Teradyne, UltraSerial60G, The first ATE solution fortesting 60Gbps high-speed devices, 5 pages (URL: https://www.teradyne.com/products/test-solutions/semiconductor-test/ultraserial60g [Retrieved Jun. 18, 2019].

Teradyne, VERTA Datasheet, Optical Power Management and Switching Instrumentation, 2 pages (Aug. 14, 2018).

Extended European Search Report for European Patent Application No. 20179690.1, 7 pages (dated Nov. 18, 2020).

* cited by examiner

FUNCTIONAL TESTING WITH INLINE PARAMETRIC TESTING

TECHNICAL FIELD

This specification describes example implementations of a test system configured to perform functional testing with inline parametric testing.

BACKGROUND

Test systems are configured to test the operation of electronic devices and electronic systems. Testing may include sending signals to a device or system and determining how the device or system reacted to those signals based on its response. The reaction will dictate whether the device or system has passed or failed testing.

SUMMARY

An example test system includes a circuit to sample a signal that is repetitive in cycles to obtain data; a processor configured to generate an eye diagram based on the data, where the eye diagram represents parametric information about the signal; and a functional test circuit to receive the signal and to perform one or more functional tests on the signal. The test system is configured to receive the signal from a unit under test and to allow the signal to pass to the functional test circuit inline without changing at least part of, e.g., the informational content of, the signal. The example test system may include one or more of the following features, either alone or in combination.

The circuit to sample the signal may be configured to obtain the data by sampling the signal in multiple cycles at intervals. The signal may have an input bandwidth and the circuit may be for sampling the signal at a rate that is less than the input bandwidth. The circuit may be configured to sample successive cycles of the signal at fixed intervals. The circuit may be configured to sample multiple cycles of the signal at a fixed interval coherently. The fixed interval may be a function of a frequency of the signal and an equivalent time sampling rate.

The test system may include test channels connected to the circuit. The circuit to perform the sampling may be configured to sample a signal from each of the test channels. The processor may be configured to generate an eye diagram for each of the test channels based on data sampled from each of the test channels. A switch may be configured to route a signal from one of the test channels to the functional test circuit.

The test system may include an input channel for receiving the signal from a unit under test. The signal may be a first signal. The test system may include an output channel for outputting a second signal to the unit under test. The output channel may include circuitry to control a parameter of the second signal. The parameter may be a voltage level of the second signal.

The input bandwidth may be 4 gigahertz or less and the sampling rate may be 100 megasamples-per-second or less. The parametric information may include one or more of the following signal parameters: rise time, fall time, jitter, minimum voltage, maximum voltage, root mean square voltage, baud rate, or histogram.

The circuit to sample the signal may include a clock recovery circuit to identify a clock signal associated with the signal; a clock circuit to generate the clock signal; and a waveform sampler circuit to sample the signal based on the clock signal. The waveform sampler circuit may include a comparator that compares the signal to a predefined value and that generates a digital signal based on the comparison. The waveform sampler circuit may include a sample-and-hold circuit that holds a value of the signal and an analog-to-digital converter that converts the value to a digital signal. The clock recovery circuit may include a phase-locked loop circuit and a voltage controlled oscillator connected in series.

The test system may include a test channel over which the signal travels. The test channel may include an electrical conductor. The electrical conductor may include copper. The functional test circuit may be configured to perform the one or more functional tests on the signal concurrently with at least one of the circuit sampling the signal or the processor generating the test eye diagram. The circuit to sample the signal and the processor may include a parametric test circuit. The parametric test circuit may be configured to receive the signal from a unit under test.

An example method includes sampling a signal that is repetitive in cycles to obtain data; generating an eye diagram based on the data, where the eye diagram represents parametric information about the signal; and sending the signal inline to a functional test circuit to perform one or more functional tests on the signal without changing informational content of the signal. The example method may include one or more of the following features, either alone or in combination.

The signal may be sampled in multiple cycles at intervals. The signal may have an input bandwidth and a circuit may be for performing the sampling the signal at a rate. The rate may be less than the input bandwidth. The signal may be sampled at successive cycles of the signal at fixed intervals. The signal may be sampled at a fixed interval coherently, where the fixed interval is a function of a frequency of the signal and an equivalent time sampling rate. The input bandwidth may be 4 gigahertz or less and the rate may be 100 megasamples-per-second or less.

The parametric information may include one or more of the following signal parameters: rise time, fall time, jitter, minimum voltage, maximum voltage, root mean square voltage, baud rate, or histogram. The one or more functional tests on the signal may be performed concurrently with at least one of the sampling of the signal or the generating of the eye diagram. Sampling and generating the eye diagram may be performed by a parametric test circuit. The parametric test circuit may receive the signal from a unit under test.

Any two or more of the features described in this specification, including in this summary section, may be combined to form implementations not specifically described in this specification.

At least part of the test systems and processes described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the test systems and processes described in this specification may be configured or controlled using a computing system comprised of one or more processing devices and memory storing instructions that are executable by the one or more processing devices to perform various control operations.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

Automatic test equipment (ATE) is an example of a test system used to test electronic devices. For example, the test system may be or include a parametric test system. A test system may be modular in that the test system may include multiple test instruments that can be connected to, and disconnected from, the test system. In an example, a test instrument is an electronic device that is configured to send known test signals to a unit under test (UUT) and to determine how the UUT reacted to those test signals based on signals that the UUT sends back to the test system. A test system may include a parametric test circuit and a functional test circuit. For example, a test system may include multiple parametric and functional test circuits; in some implementations one of each for each test channel.

A parametric test circuit is configured to measure characteristics of a signal, such as voltage level, jitter, rise time, and fall time, and to determine whether those characteristics are within acceptable levels. In an example, if the characteristics are within acceptable levels, then the signal has passed parametric testing. A functional test circuit is configured to test the informational content of a signal. For example, a functional test circuit may be configured to identify data that the signal represents and to determine whether that data is correct based on the known test signal.

In some traditional test systems, parametric testing and functional testing has been mutually exclusive. For example, the test system may send signals to a parametric test circuit for processing and, after those signals have been processed by the parametric test circuit, then send the signals to a functional test circuit for processing. This approach can increase testing time in some cases.

Described herein are example test systems that are configured to perform parametric testing and functional testing inline. For example, circuitry for performing parametric and functional testing may be configured so that signals from a UUT are sent concurrently to both a parametric test circuit and a functional test circuit. For example, the parametric circuit may receive the signals and perform parametric testing on the signals. The test system may also allow the signal to pass to the functional test circuit without changing at least part of the signal. The functional test circuit may therefore perform functional testing on the signal at the same time that the parametric test circuit performs parametric testing on the same signal. This can reduce testing time.

Figure 1:
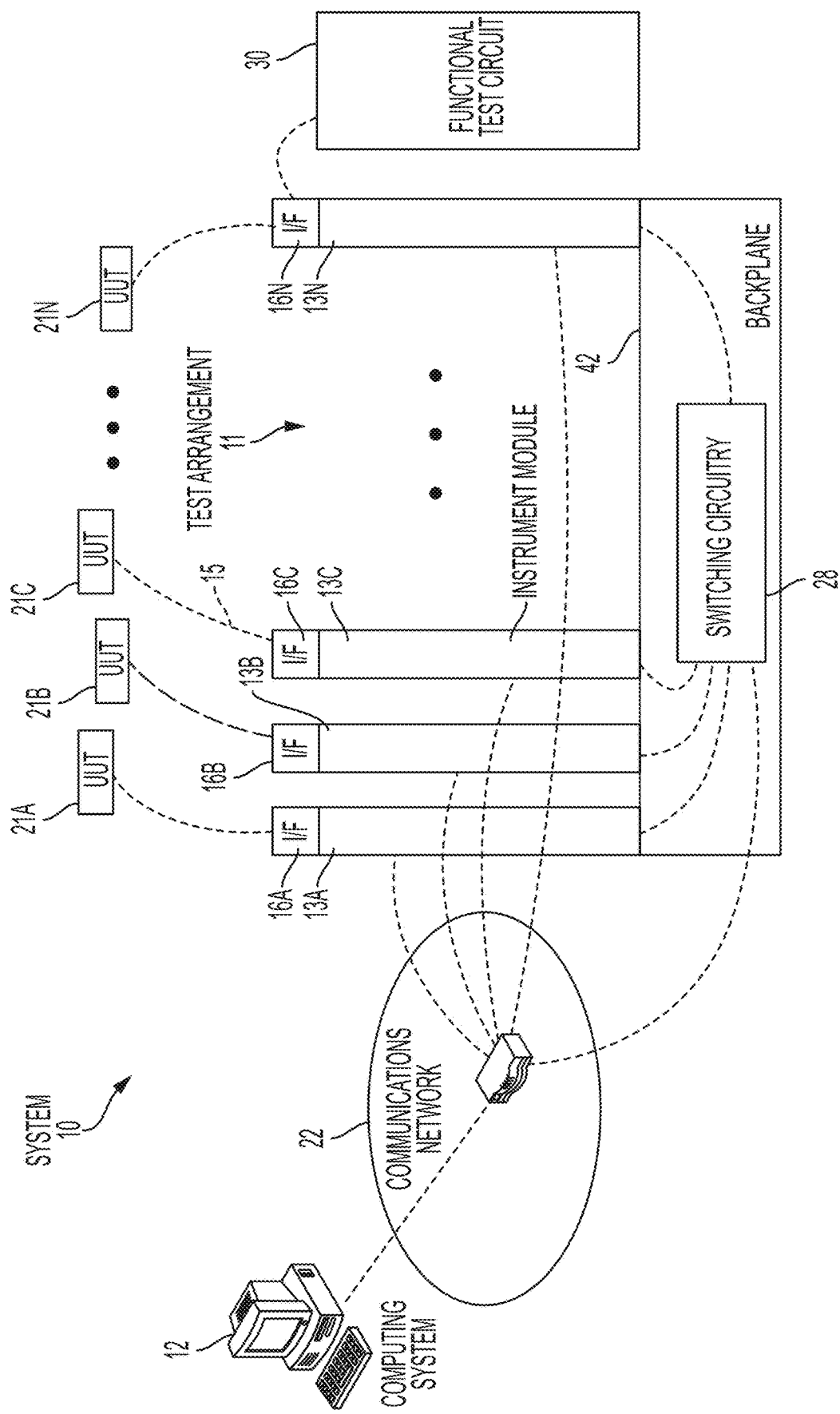
FIG. 1 is a block diagram of components of an example system that incorporates an implementation of the inline parametric and functional testing described herein.

FIG. 1 shows components of example test system 10 that incorporates inline functional testing and parametric testing. In FIG. 1, the dashed lines represent, conceptually, potential signal paths between components of the system.

System 10 includes a test arrangement 11 and the host computing system 12. The host computing system is a control system in this example. The host computing system may be a computing system comprised of one or more microprocessors or other appropriate processing devices as described herein. Test arrangement 11 may include interfaces to one or more UUTs 21A to 21N on which tests are performed. Host computing system 12 communicates with components of the test arrangement to control testing. For example, host computing system 12 may download test program sets to instrument modules 13A to 13N in the test arrangement. Instrument modules 13A to 13N then run the test program sets to test UUTs in communication with the instrument modules. Host computing system 12 may also send, to instrument modules in the test arrangement, instructions, test data, and/or other information that are usable by the corresponding instrument module to perform appropriate tests on a UUT interfaced thereto. In some implementations, this information may be sent via a computer or other type of network 22. In some implementations, this information may be sent via a computer network, such as a local area network (LAN) or a wide area network (WAN).

Host computing system 12 may configure switching circuitry 28 based on user-provided, or other, programmatic inputs. Switching circuitry 28 may be configured—for example, programmed or constructed—to implement one or switches that are controllable by the control system to route signals between a parametric test circuit and a functional test circuit. In some implementations, the switching circuitry may be implemented on programmable logic, such as an FPGA, or it may be implemented using non-programmable logic. in some implementations, switching circuitry 28 may be replaced by one or more direct connections between a signal input and a functional test circuit that performs functional testing. In some implementations, the switching circuitry is configured to perform switching for multiple signal paths such as four test channels.

In some implementations, host computing system 12 does not communicate directly with instrument modules 13A to 13N. Rather, there is a local bus that is controllable by a field programmable gate array (FPGA) on backplane 42 that handles communication between the instrument modules and the host computing system. In some implementations, the FPGA that handles the communications is the same FPGA that implements switching circuitry 28.

In the example of FIG. 1, system 10 includes multiple instrument modules 13A to 13N, each of which may be configured, as appropriate, to perform one or more of testing and/or other functions. Although only four instrument modules are depicted, the system may include any appropriate number of instrument modules, including those residing outside of test arrangement 11. In some implementations, each instrument module may be configured to output test signals to test a UUT based, e.g., on data provided by the host computing system, and to receive response signals from the UUT. Different instrument modules may be configured to perform different tests and/or be configured to test different UUTs. The signals received may include response signals that are based on the test signals and/or signals that originate from the UUT that are not prompted by (e.g., are not in response to) test signals. In some implementations, there may be electrical conductors, such as copper wires, between the UUT and the instrument module interfaces over which test and response signals are sent.

Each instrument module has a corresponding interface (I/F) circuit 16A to 16N for outputting signals to, and receiving signals from, a corresponding UUT. In some implementations, each interface circuit may be implemented using a device, such as an FPGA, an application-specific integrated circuit (ASIC), or other appropriate hardware. Input circuitry and output circuitry for an instrument module may reside in the interface (I/F) of each instrument module. In this regard, each instrument module may include input circuitry for receiving signals from one or more UUTs or other appropriate signal source(s). Each instrument module may also include output circuitry for outputting signals to a communication channel defined by the instrument module. In some implementations, each instance of the input circuitry includes a parametric test circuit configured to receive a signal and to obtain parametric information about the signal. Examples of parametric information include, but are not limited to the following parameters of a signal waveform: rise time, fall time, jitter, minimum voltage, maximum voltage, root mean square voltage, baud rate, or a histogram. In some implementations, the parametric information may be measured by the interface circuit and converted to digital data by the interface circuit or other appropriate logic.

In some implementations, each instrument module 13A to 13N may include a parametric test circuit configured to measure parametric information about a signal received via the corresponding interface circuit. In some implementations, there may be multiple instances of the parametric test circuit distributed across two or more instrument modules 13A to 13N. In any case, the instrument module may send data representing the parametric information to the host computing system for processing. As described herein, processing may include generating an eye diagram based on response signals sent by one or more UUTs in response to test signals.

Functional test circuitry 30 includes circuitry to test the informational content of signals received from a UUT. As explained, test signals comprise waveforms that have known parametrics and informational content. Response signals comprise waveforms having expected parametrics and expected informational content. The waveforms for the test signals may be repetitive when viewed over a sufficiently long time scale. For example, each waveform may have the same amplitude, frequency, or both amplitude and frequency over two or more adjacent time intervals. Consequently, the waveforms for the response signals that are received in response to the test signals may also be repetitive when viewed over the same time scale as the test signals. If the response waveforms deviate from what is expected, the UUT may be defective. The functional test circuit is configured to perform the one or more functional tests on a signal to identify the informational content of the signal—for example a bit pattern represented by the signal—and to compare that informational content to the informational content that is expected. If the informational content of the response signal deviates by more than an expected amount from the expected informational content, the UUT may fail testing.

In some implementations, functional test circuit 30 may be connected to the test system via one or more interfaces 16A to 16N. Although connection to a single interface 16N is shown in FIG. 1, connection may be through more than one or all interfaces 16A to 16N. In some implementations, functional test circuit 30 may be connected to the test system via backplane 42, e.g., via circuitry 43. In some implementations, functional test circuit 30 may be plugged into backplane 42. In some implementations, functional test circuit 30 may be connected to the test system via an instrument module, such as instrument module 13N. For example, the instrument module may allow signals to pass between the backplane and the functional test circuit. In some implementations, functional test circuit 30 may be in, or part of, an instrument module 13A to 13N. In some implementations, there may be multiple instances of functional test circuit 30 distributed across two or more instrument modules 13A to 13N.

In the implementation of FIG. 1, instrument modules 13A to 13N may be interconnected through backplane 42 or any other appropriate electrical or mechanical mechanism. For example, instrument modules 13A to 13N may mechanically interface, e.g., plug into, backplane 42 of FIG. 1. Backplane 42 may include one or more transmission media over which signals pass among the various components of FIG. 1. For example, the transmission media may be, or include, one or more serial buses such as a peripheral component interconnect express (PCIe) bus, Ethernet cable, or appropriate types of copper or other conductive transmission media.

Communications among the components of FIG. 1 may pass through switching circuitry 28 which may include one or more programmable switching matrices in some implementations. Switching circuitry 28 is configurable to receive informational content data and parametric data, and to distribute the informational content data and parametric data among the components, including the instrument modules and the functional test circuit. Informational content data received from a component may be provided to one or more of the same communication channels ("channels") within the test system or to one or more different communication channels within the test system. Parametric data received from a component may be provided to one or more of the same communication channels or to one or more different communication channels. In some implementations, some or all of the informational content data and some or all of the parametric data from the same signal may be sent to the same one or more components of the system. In some implementations, some or all of the informational content data and some or all of the parametric data from the same signal may be sent to different components. In some implementations, some of the informational content data from a signal may be sent to one set of components and some of the parametric data from the same signal may be sent to another set of components, possibly with the first and second sets overlapping at least in part. In some implementations, the informational content data and the parametric data from the same signal may be sent to different numbers of components or to the same number of components. Basically, any routing that is appropriate given the architecture of the system may be implemented. In some implementations, instrument modules, the functional test circuit, or both the instrument modules and the functional test circuit may receive data from the switching circuitry, manipulate that data, and send the data back to the switching circuitry.

A separate processing device, such as a microprocessor, which may or may not reside on the backplane, may perform at least some of the processing described herein before, during, or after distribution implemented by the switches. In some implementations, network 22 communicates with instrument the components of FIG. 1 using transmission media and logic on the backplane 42. In some implementations, network 22 may be an appropriate Ethernet-based communication network, a wireless network, or some combination thereof.

Figure 2:
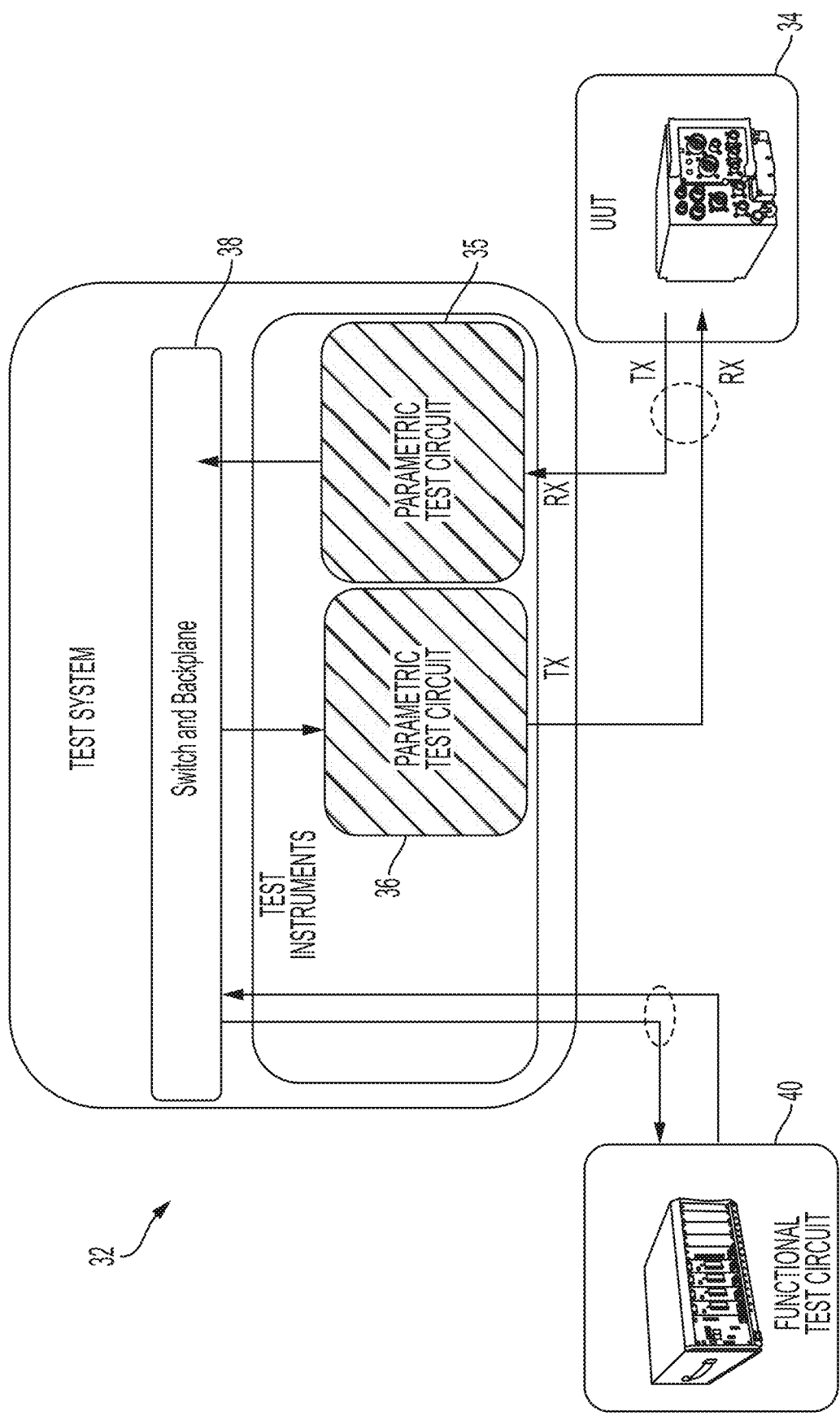
FIG. 2 is a block diagram of components of an example system that incorporates an implementation of the inline parametric and functional testing described herein.

FIG. 2 shows components of a system 32 that may have all or some of the structure and function of system 10. In FIG. 2, example UUT 34 is connected to parametric test circuits 35, 36 in test system 32. "TX" refers to a transmitted signal, also referred to as an outgoing or output signal. "RX" refers to a received signal, also referred to as an incoming or input signal. Backplane 38 includes transmission media (not shown) for passing response signals received, for example, via parametric test circuit 35 to functional test circuit 40 without changing the informational content—for example, the composition of bits—in those signals.

Backplane 38 may, or may not, contain switching circuitry, such as switching circuitry 28, for selectively directing signals among components of the test system including the test instruments, the parametric test circuits, the functional test circuit, and the UUT. In this regard, in some implementations, the switching circuitry may be omitted and the signals may pass along dedicated transmission media between the backplane and the functional test circuit, between the parametric test circuit and the functional test circuit, or between a test channel and the functional test circuit (for example, without the signals passing through the parametric test circuit first).

Figure 3:
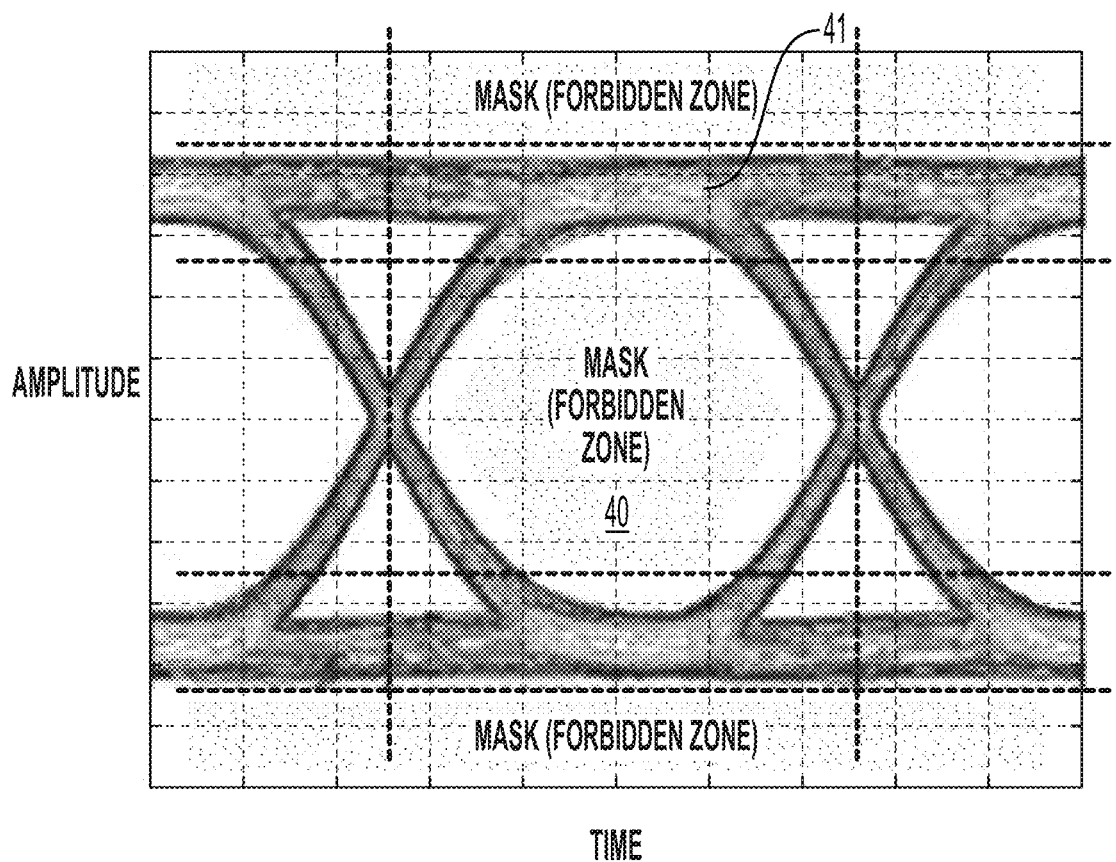
FIG. 3 is an example eye diagram.

As explained previously, the example test systems described herein are configured to perform functional testing and inline parametric testing, for example, concurrently. In operation, a parametric test circuit receives a signal from a UUT. The parametric test circuit samples the signal and generates data for an eye diagram based on the sampled data. The eye diagram represents parametric information about the signal. In an example, an eye diagram includes a display in which a response signal, such as a digital signal, received from a UUT is repetitively sampled and applied to a vertical input, while the data rate of the signal is used to trigger a horizontal sweep. The resulting pattern resembles one or more open eyes, as shown in FIG. 3.

An eye diagram can be used to determine parametric information for a signal, such as maximum voltage, minimum voltage, root mean square (RMS) voltage, rise time, fall time, eye mask, jitter, signal histogram, and baud rate. In addition to the these example measurement options, a user selectable eye mask can be chosen to verify a minimum UUT performance required, for example, at the end of a cable by testing to a more stringent eye mask requirement at the output of the UUT. This provides the ability, for example, to test the effects of the cable loss without using a cable. Additionally, since the measurement is taken very close to the UUT, the parametric results closely represent the UUT's actual performance. An example mask 40 is shown in eye diagram 41 of FIG. 3. One or more signal hits within the mask may indicate that a UUT has failed testing. The number of hits needed to fail testing may be set by a user.

Figure 4:
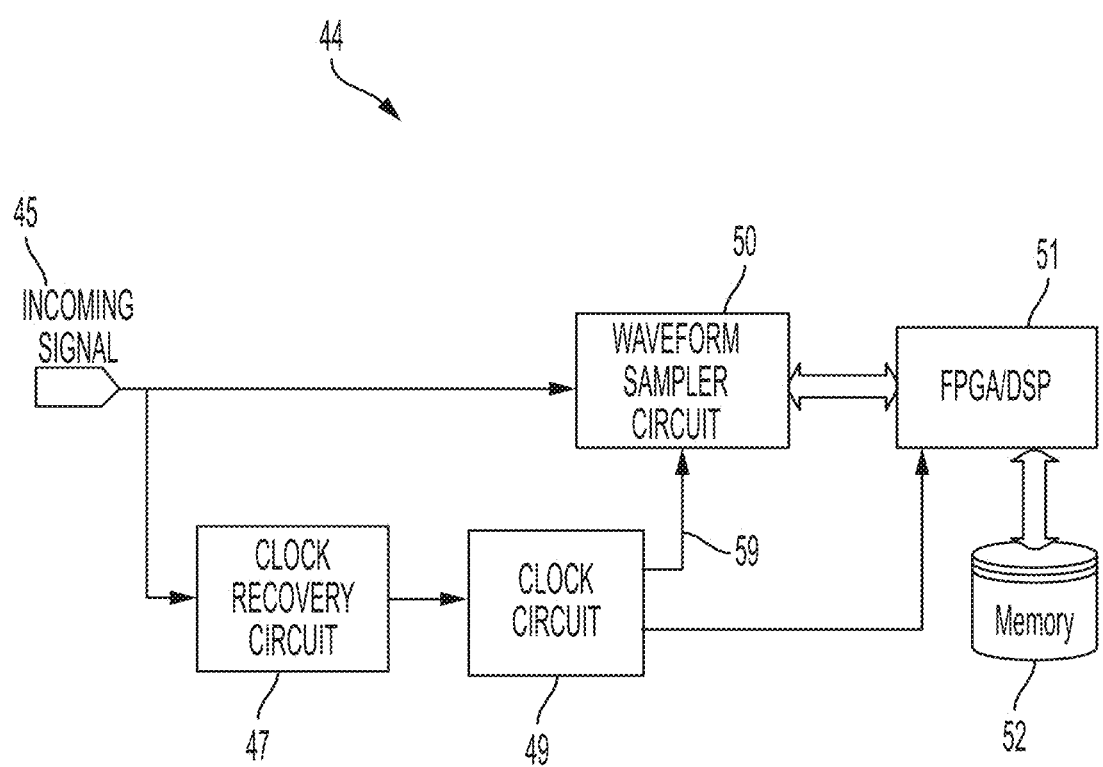
FIG. 4 is an example of a circuit that may be included in a parametric test circuit to generate data for producing an eye diagram.

FIG. 4 shows an example of a circuit 44 that may be included in each parametric test circuit to generate data for producing the eye diagram. In some implementations, circuit 44 may produce the eye diagram for output to a visual display, such as a computer monitor. In some implementations, circuit 44 may generate data that is then passed, for example, to the host computing system to produce and to render an eye diagram on a visual display, such as a computer monitor.

Circuit 44 obtains data used to produce an eye diagram for a repetitive signal having a known data rate. In this regard, as previously explained, waveforms for test signals may be repetitive when viewed over a sufficiently long time scale. Consequently, the waveforms for the response signals that are received in response to the test signals may also be repetitive when viewed over the same time scale as the test signals. One or more eye diagrams may be generated for the response signals.

In this regard, circuit 44 is configured to undersample an incoming signal 45, such as a response signal, and to reconstruct the sampled data to produce data for the eye diagram. Circuit 44 operates on the premise that the data pattern represented by the incoming signal is repetitive and uses a coding scheme that ensures a level transition over the course of two or more data cycles. Circuit 44 includes a clock recovery circuit 47 to identify a clock signal associated with the incoming signal, a clock circuit 49 to recreate the clock signal identified by the clock recovery circuit 47, and a waveform sampler circuit 50 to sample the incoming signal based on the clock signal generated by the clock circuit. An FPGA or digital signal processor (DSP) 51 is configured—for example, programmed—to receive the sampled data from the waveform sampler circuit and to store that data in memory 52. In some implementations, the data is processed by FPGA/DSP 51 to produce the eye diagram and the resulting processed data is stored in memory 52. That data may be rendered on a visual display. In some implementations, the data is not processed and the sampled data is forwarded to the host computing system to produce the eye diagram.

The waveform sampler circuit 50 is configured to undersample incoming signal 45, as noted previously. In this regard, waveform sampler circuit 50 is configured obtain sampled data by sampling the incoming signal in successive multiple cycles of the signal at fixed intervals. In some implementations, the fixed interval is a function of a frequency of the signal and a desired equivalent time sampling rate, which is described in more detail below. The signal has an input bandwidth and the waveform sampler circuit samples the signal at a rate that is less than the input bandwidth. For example, the signal may have an input bandwidth of 4 gigahertz or less and the sampling rate may be 100 megasamples-per-second or less. This type of sampling will enable reconstruction of repetitive signals for reasons explained below.

Figure 5:
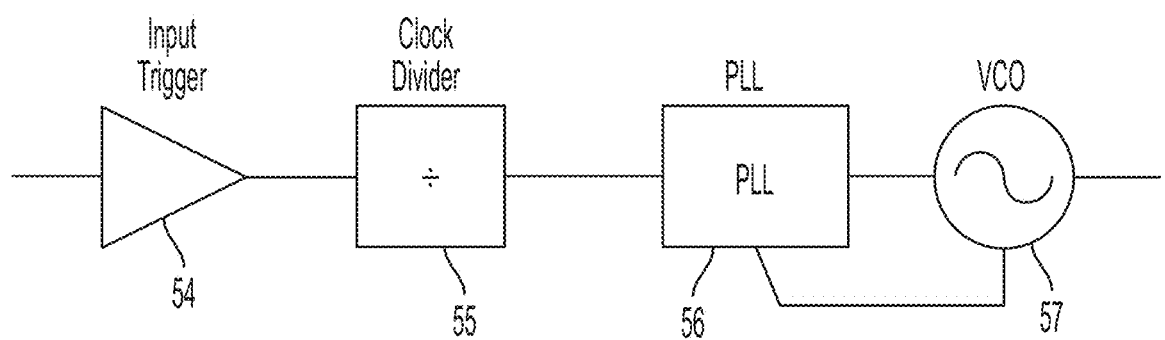
FIG. 5 is example of a clock recovery circuit that may be used to recreate the clock signal of an incoming signal.

Clock recovery circuit 47 is configured to synchronize waveform sampler circuit 50 to the fundamental frequency of the incoming signal's data input. In this example, as shown in FIG. 5, clock recovery circuit 47 includes an input trigger circuit 54, a clock divider circuit 55, a phase-locked loop (PLL) circuit 56, and a voltage controlled oscillator (VCO) circuit 57 connected in series. These components operate to identify the clock of the incoming signal and to control clock circuit 49 to reproduce that clock signal, which is used by waveform sampler circuit 50 to sample incoming signal 45 and to clock FPGA/DAP 51. Assuming the incoming signal is using 8b/10 encoding or a similar repetitive encoding scheme, clock circuit 49 is able to generate a stable, relatively low-jitter reference clock signal. The waveform sampler circuit 50 then samples the incoming signal 45 at that clock signal.

In some implementations, waveform sampler circuit 50 performs sampling using a sequential equivalent time sampling (ETS) technique. Examples of ETS techniques include, but are not limited to: (i) sampling using a coherent pulse, and (ii) sampling using a delayed pulse.

Figure 6:
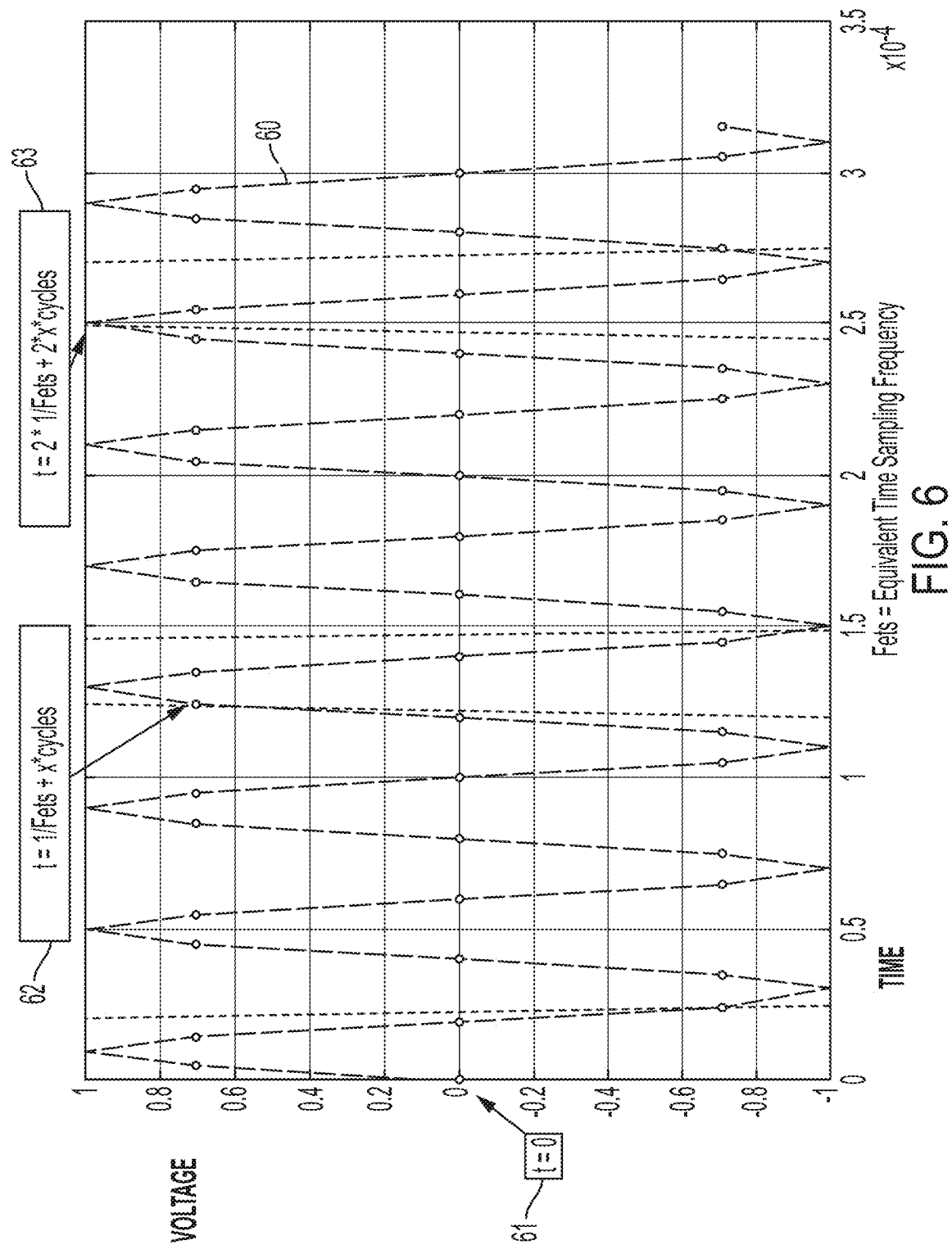
FIG. 6 is graph illustrating equivalent time sampling (ETS) using a coherent pulse technique.

Sampling using a coherent pulse includes undersampling the incoming signal by using a sample pulse frequency that is a function of the fundamental frequency of the incoming signal and a desired ETS frequency. The sample frequency is determined so that a sample at each ETS time point is captured many times over many cycles. A histogram of the sampled data can then be used to generate the eye diagram data. In this example, $$F\text{sample} = F\text{ets}/(\text{num\_bins}+1),$$

where "Fsample" is the frequency of the sampling pulse, "Fets" is the ETS Frequency, and "num_bins" is the number of time bins per data cycle. The number of time bins can be calculated by dividing the ETS frequency by the fundamental frequency of the incoming signal (num_bins=Fets/Fsignal) or the ETS frequency can be calculated by multiplying the fundamental frequency of the incoming signal by the number of time bins (Fets=num_bins*Fsignal). The number of time bins is typically an integer. The sample pulse may be generated using a Direct Digital Synthesizer (DDS) that is synchronous to the clock signal output by clock circuit 49. FIG. 6 shows an example of ETS performed on a repetitive waveform 60. As shown, the samples are obtained at times 61, 62, and 63. Only three samples are shown; however, in practice, hundreds, thousands, or more samples may be taken. The samples effectively walk-through the waveform in different cycles. Since the waveform is repetitive, the sampling is sufficient to reconstruct the waveform and to generate data to produce the eye diagram.

Figure 7B:
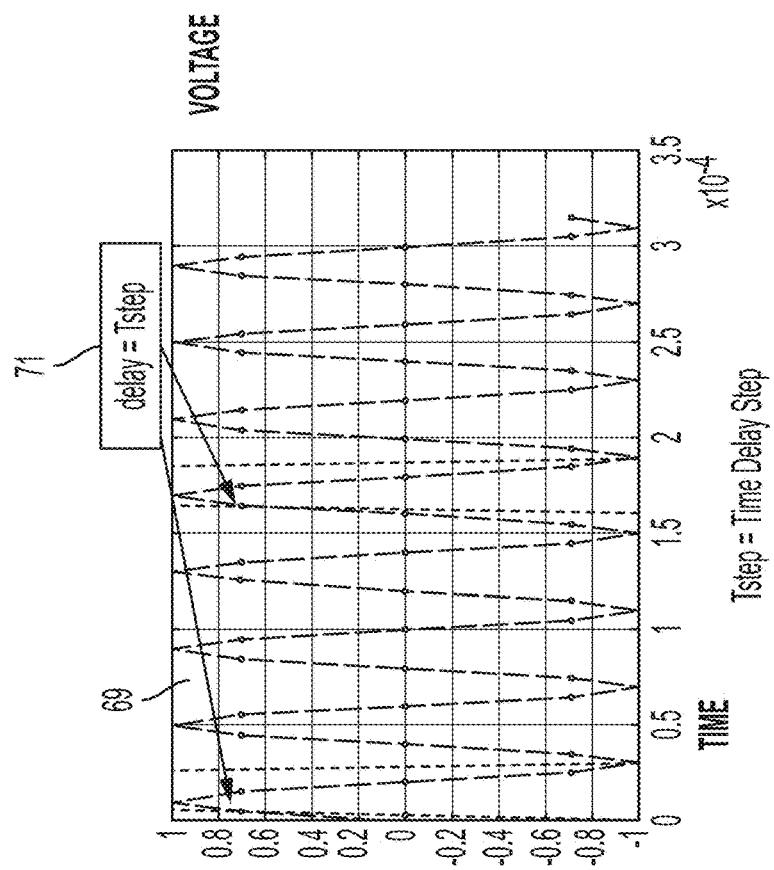
FIGS. 7A and 7B are graphs illustrating equivalent time sampling (ETS) using delayed pulse sampling.
Figure 7A:
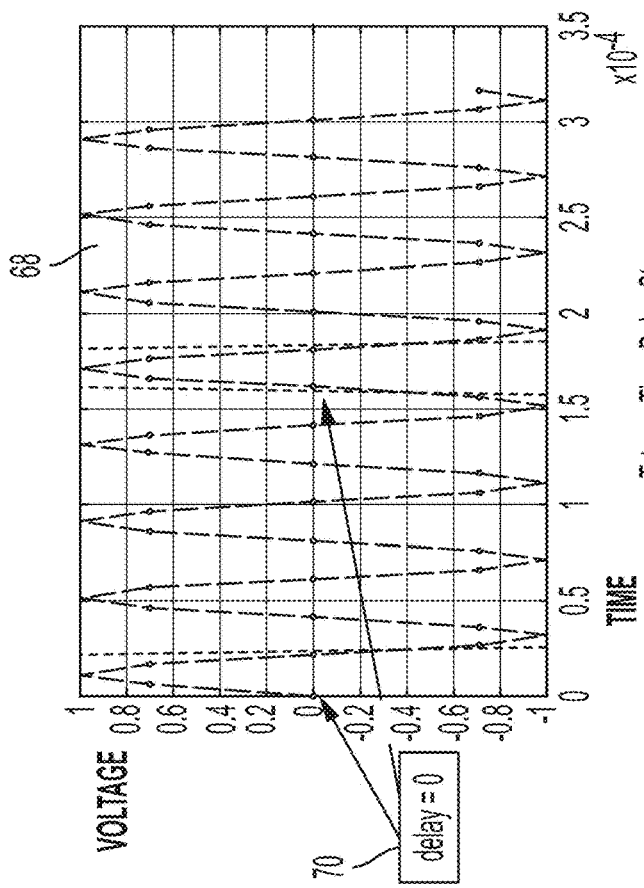

Sampling using a delayed pulse includes sampling the incoming signal by capturing samples at fixed time delays ("time_delay_step"). The ETS frequency is a function of the time delay step; for example, Fets=1/time_delay_step. The clock signal output by clock circuit 49 is used to synchronize a captured start to the incoming data. The delays may be generated using a combination of internal FPGA delay elements and components specifically designed to provide selectable time delays. FIGS. 7A and 7B show example captures 68 and 69, respectively, for different delays, namely "0" 70 and "delay=Tstep" 70. Because the signal repeats, this sampling is sufficient to reconstruct the waveform and to generate data to produce the eye diagram.

Figure 8:
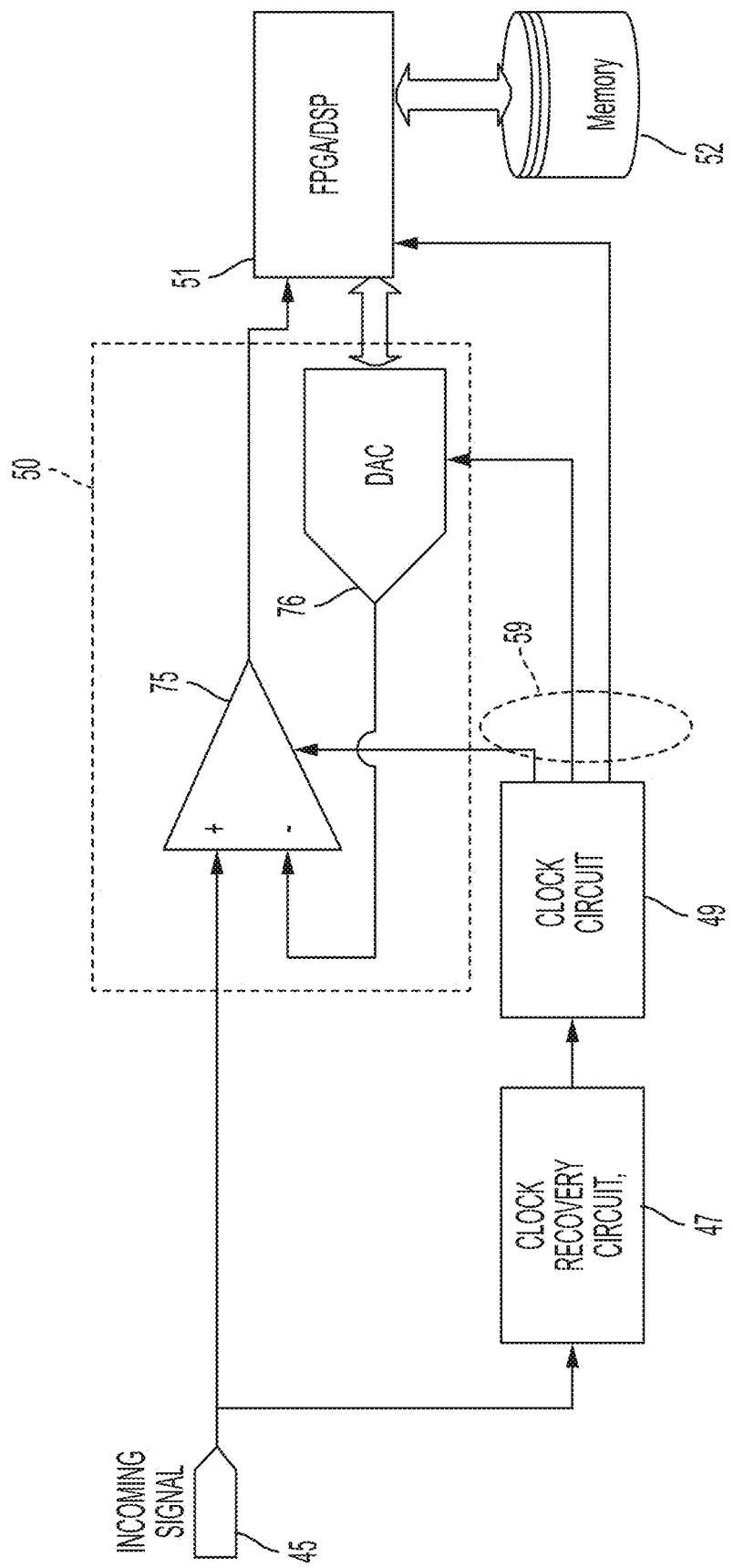
FIG. 8 is an example of a circuit of the type shown in FIG. 4 showing the details of an implementation of a waveform sampling circuit.
Figure 9:
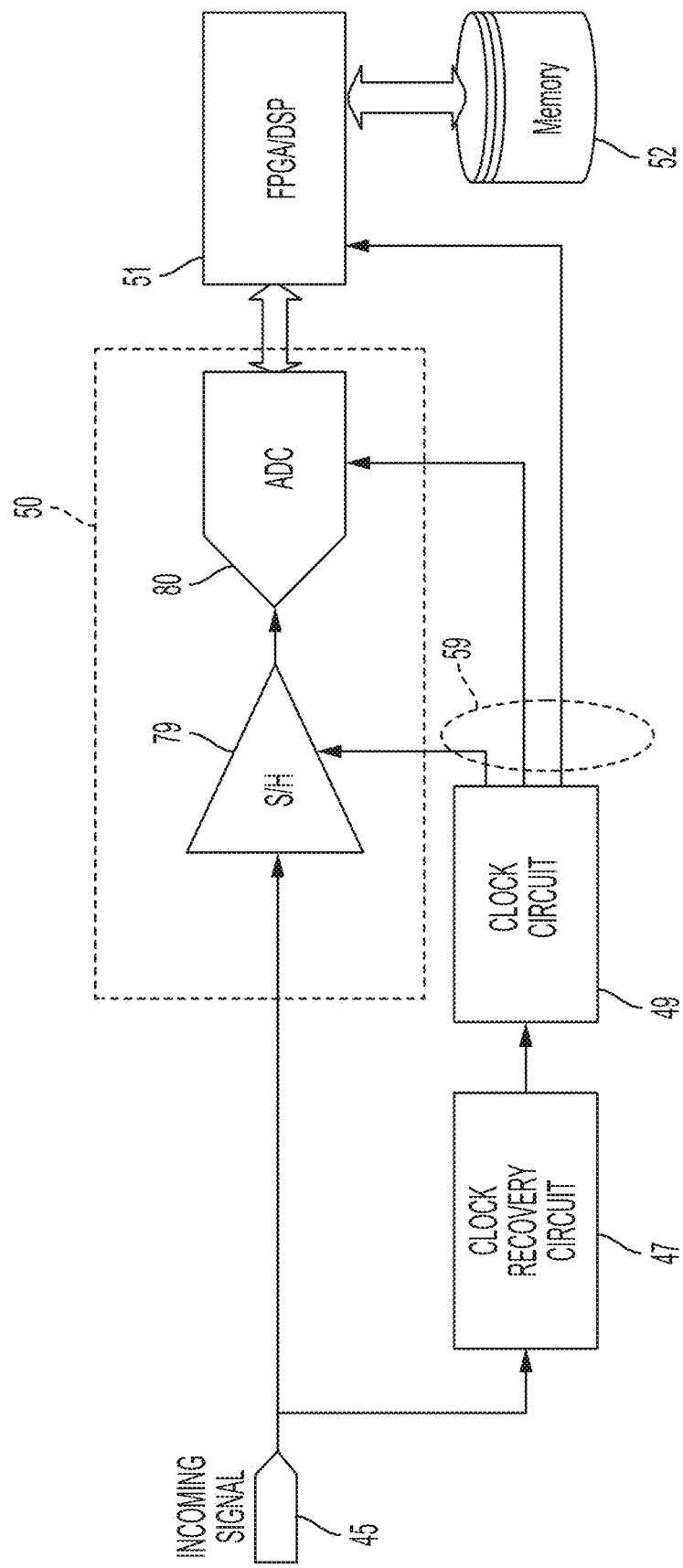
FIG. 9 is an example of a circuit of the type shown in FIG. 4 showing the details of an implementation of a waveform sampling circuit.

FIGS. 8 and 9 show different implementations of the waveform sampler circuit 50 incorporated into the circuitry of FIG. 4. In FIG. 8, the waveform sampler circuit 50 includes a comparator 75 configured to compare incoming signal 45 to a threshold value generated by digital-to-analog converter (DAC) 76 from data obtained from memory 52, for example. The resulting sampled data is processed as described herein. In FIG. 9, the waveform sampler circuit 50 includes a sample hand hold (S/H) circuit 79. S/H circuit 79 is configured to hold a value of the incoming signal 45 for a time dictated by sample clock 59. Analog-to-digital converter 80 converts the resulting analog information into sampled digital data. The resulting sampled data is processed as described herein. Clock 59 also controls ADC 80 and FPGA/DSP 51.

Figure 10:
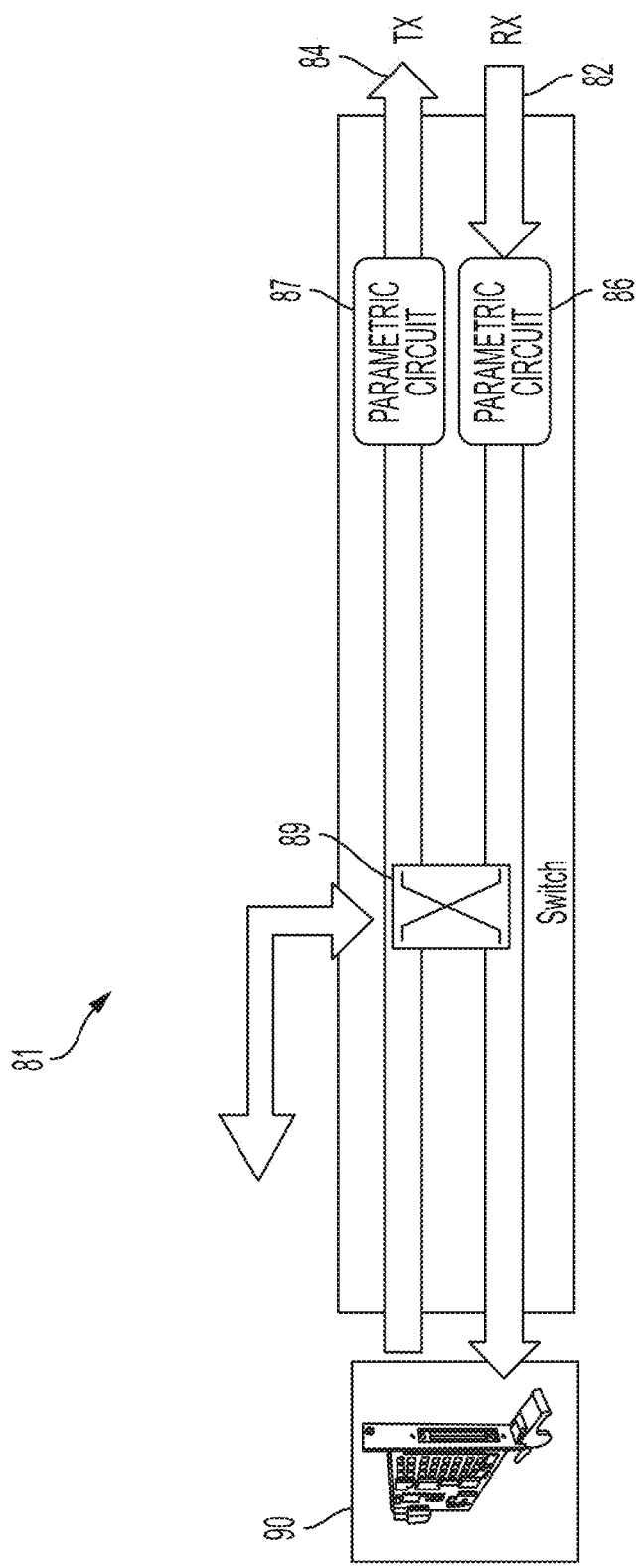
FIG. 10 is a block diagram of components of an example system that incorporates an implementation of the inline parametric and functional testing described herein.

FIG. 10 shows an example implementation of components of a test system 81 of the type described herein that includes one or more input (RX) channels 82 for receiving a signal from a UUT (not shown) and one or more output (TX) channels 84 for outputting a signal to the UUT. In this example, parametric circuits 86 and 87 are included on both input and output channels 82 and 84 of the system, respectively. A switch 89, which may be of the type described herein such as switching circuitry 28 of FIG. 1, is controllable by a control system, such as the host computing system, to create connections to or from different channels and between different system components. The test channels also interface to functional test circuit 90. Parametric circuit 86, switch 89, and functional test circuit 90 may operate as described previously. In this regard, in some implementations, switch 89 includes one or more switches that are controllable to route input signals to functional test circuit 90, to and from other functional test circuits (not shown), and/or to different test modules (not shown). In some implementations, switch 89 may also be controllable to route output signals from functional test circuit 30, from other functional test circuits (not shown), and/or from different test modules (not shown) to a destination, such as UUT or the host computing system.

In some implementations, parametric circuit 87 is controllable to change parametric information on outgoing signals. Parametric circuit 36 (FIG. 2) may include the same structure and function as parametric circuit 87. In an example, parametric circuit 87 may be controllable to change the voltage level of an output signal to mimic a particular transmission line (e.g., a coaxial electrical cable) length. In this regard, in some cases, voltage over transmission lines may decrease as the length of the lines increase. The voltage of the output signal may be set—for example, decreased—to simulate the voltage of a transmission line having a specified length. Other parameters of the output signal may also be controlled, such as those described herein.

In another example, a typical coaxial or high-speed data cable may experience increased insertion loss and degrading return loss over frequency. In a data transmit application, excessive cable lengths reduce the waveform's level below the receiver's threshold causing bit errors or loss of connection. A cable simulation attenuator cannot exactly mimic the insertion loss, delay, and impedance match of an actual cable; however, adding insertion loss to a test signal can effectively margin test a receiver. Parametric circuit 87 may be configured to add that insertion loss using a fixed/flat attenuator.

Figure 11:
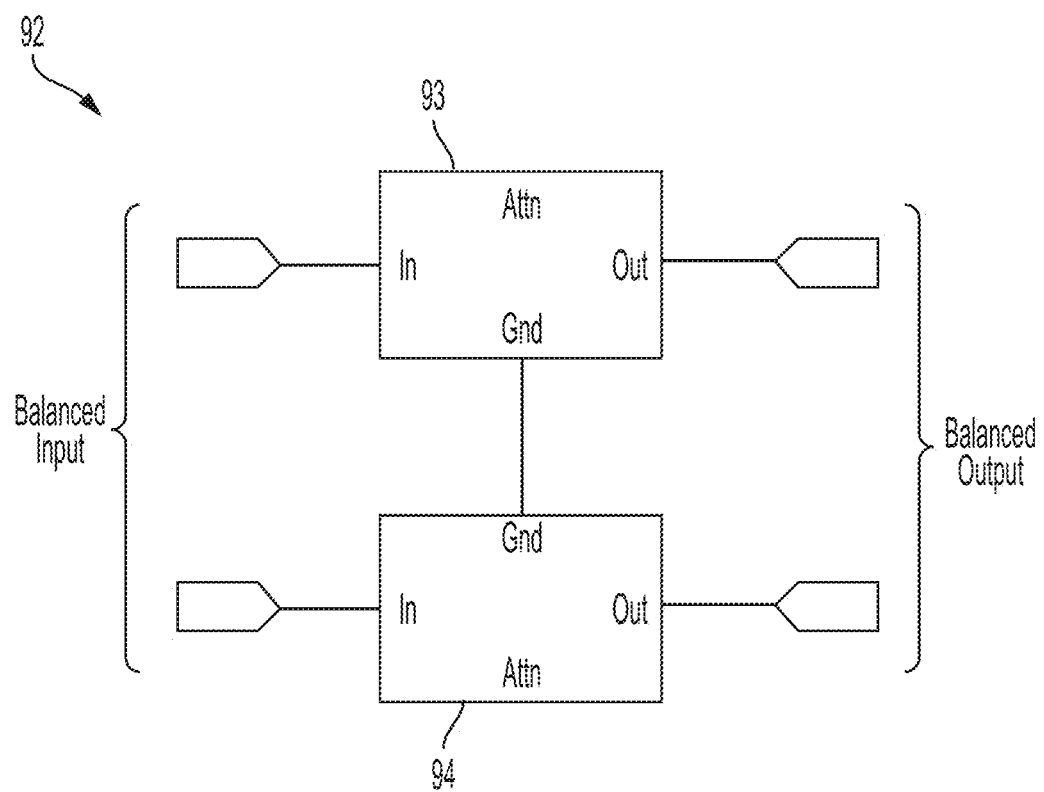
FIG. 11 is an example of a circuit that may be included in a parametric test circuit to attenuate an output signal.

A flat/fixed attenuator may provide a small amount of attenuation at its lowest setting and equal amounts of attenuation over the operational frequency band as the attenuation is increased. In an example, the attenuation is set in steps, for example, with 0.25 dB or smaller resolution. In the example 92 of FIG. 11, two 500 stepped attenuators 93, 94 may be used or a discrete PIN diode attenuator may be used. These parts are typically unbalanced 500 designs, so two attenuators may be required to provide a balanced 1000 circuit. The ground connection (GND) could either by connected to the adjacent component ground or individually connected to the system ground. Two attenuators are used in this example to attenuate a differential signal.

All or part of the test systems and processes described in this specification and their various modifications may be configured or controlled at least in part by one or more computers such as host computing system 12 using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the test systems and processes can be performed by one or more programmable processors executing one or more computer programs to control all or some of the well formation operations described previously. All or part of the test systems and processes can be configured or controlled by special purpose logic circuitry, such as, an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A test system comprising:
a circuit to sample a signal that is repetitive in cycles to obtain data;
a processor configured to generate an eye diagram based on the data, the eye diagram representing parametric information about the signal; and
a functional test circuit to receive the signal and to perform one or more functional tests on the signal;
wherein the test system is configured to receive the signal from a unit under test and to allow the signal to pass to the functional test circuit inline without changing at least part of the signal; and
wherein the circuit is configured to obtain the data by, sampling the signal in multiple cycles at intervals, the signal having an input bandwidth and the circuit for sampling the signal at a rate, the rate being less than the input bandwidth.

2. The test system of claim 1, wherein the circuit is configured to sample successive cycles of the signal at fixed intervals.

3. The test system of claim 1, wherein the circuit is configured to sample multiple cycles of the signal at a fixed interval coherently, the fixed interval being a function of a frequency of the signal and an equivalent time sampling rate.

4. The test system of claim 1, further comprising:
test channels connected to the circuit, the circuit being configured to sample a signal from each of the test channels;
the processor being configured to generate an eye diagram for each of the test channels based on data sampled from each of the test channels; and
a switch to route a signal from one of the test channels to the functional test circuit.

5. The test system of claim 1, wherein the input bandwidth is 4 gigahertz or less and the sampling rate is 100 mega-samples-per-second or less.

6. The test system of claim 1, further comprising:
a test channel over which the signal travels, the test channel comprising an electrical conductor.

7. The test system of claim 6, wherein the electrical conductor comprises copper.

8. A test system comprising:
a circuit to sample a signal that is repetitive in cycles to obtain data;
a processor configured to generate an eye diagram based on the data, the eye diagram representing parametric information about the signal; and
a functional test circuit to receive the signal and to perform one or more functional tests on the signal;
wherein the test system is configured to receive the signal from a unit under test and to allow the signal to pass to the functional test circuit inline without changing at least part of the signal; and
wherein the functional test circuit is configured to perform the one or more functional tests on the signal concurrently with at least one of the circuit sampling the signal or the processor generating the test eye diagram.

9. The test system of claim 8, further comprising:
an input channel for receiving the signal from the unit under test, the signal being a first signal; and
an output channel for outputting a second signal to the unit under test, the output channel comprising circuitry to control a parameter of the second signal.

10. The test system of claim 9, wherein the parameter is a voltage level of the second signal.

11. The test system of claim 8, wherein the parametric information comprises one or more of the following signal parameters: rise time, fall time, jitter, minimum voltage, maximum voltage, root mean square voltage, baud rate, or histogram.

12. The test system of claim 8, wherein the circuit comprises:
a clock recovery circuit to identify a clock signal associated with the signal;
a clock circuit to generate the clock signal; and
a waveform sampler circuit to sample the signal based on the clock signal.

13. The test system of claim 12, wherein the waveform sampler circuit comprises a comparator that compares the signal to a predefined value and generates a digital signal based on the comparison.

14. The test system of claim 12, wherein the waveform sampler circuit comprises:
a sample-and-hold circuit that holds a value of the signal; and
an analog-to-digital converter that converts the value to a digital signal.

15. The test system of claim 12, wherein the clock recovery circuit comprises a phase-locked loop circuit and a voltage controlled oscillator connected in series.

16. The test system of claim 8, wherein the circuit and the processor comprise a parametric test circuit, the parametric test circuit being configured to receive the signal from a unit under test.

17. The test system of claim 8, further comprising:
test channels connected to the circuit, the circuit being configured to sample a signal from each of the test channels;
the processor being configured to generate an eye diagram for each of the test channels based on data sampled from each of the test channels; and
a switch to route a signal from one of the test channels to the functional test circuit.

18. A method comprising:
sampling a signal that is repetitive in cycles to obtain data;
generating an eye diagram based on the data, the eye diagram representing parametric information about the signal; and
sending the signal inline to a functional test circuit to perform one or more functional tests on the signal without changing informational content of the signal;
wherein the signal is sampled in multiple cycles at intervals, the signal having an input bandwidth and a circuit may perform the sampling the signal at a rate, the rate being less than the input bandwidth.

19. The method of claim 18, wherein the signal is sampled at successive cycles of the signal at fixed intervals.

20. The method of claim 18, the signal is sampled at a fixed interval coherently, the fixed interval being a function of a frequency of the signal and an equivalent time sampling rate.

21. The method of claim 18, wherein the input bandwidth is 4 gigahertz or less and the rate is 100 megasamples-per-second or less.

22. The method of claim 18, wherein the parametric information comprises one or more of the following signal parameters: rise time, fall time, jitter, minimum voltage, maximum voltage, root mean square voltage, baud rate, or histogram.

23. A method comprising:
sampling a signal that is repetitive in cycles to obtain data;
generating an eye diagram based on the data, the eye diagram representing parametric information about the signal; and
sending the signal inline to a functional test circuit to perform one or more functional tests on the signal without changing informational content of the signal;
wherein the one or more functional tests on the signal are performed concurrently with at least one of the sampling the signal or the generating the eye diagram.

24. The method of claim 23, wherein sampling and generating the eye diagram are performed by a parametric test circuit, the parametric test circuit receiving the signal from a unit under test.

\* \* \* \* \*